United States Patent [19]

Hölzle

[11] Patent Number: 5,248,937
[45] Date of Patent: Sep. 28, 1993

[54] CIRCUIT CONFIGURATION FOR SIGNAL TESTING OF FUNCTIONAL UNITS OF INTEGRATED CIRCUITS

[75] Inventor: Josef Hölzle, Bad Wörishofen, Fed. Rep. of Germany

[73] Assignee: Siemens Aktiengesellschaft, Munich, Fed. Rep. of Germany

[21] Appl. No.: 847,791

[22] Filed: Mar. 6, 1992

[30] Foreign Application Priority Data

Mar. 6, 1991 [DE] Fed. Rep. of Germany ....... 4107172

[51] Int. Cl.⁵ .................. G01R 31/02; G01R 31/28
[52] U.S. Cl. ................................ 324/158 R; 371/15.1
[58] Field of Search .............. 324/158 R, 158 F, 73.1; 371/15.1, 20.1, 22.3, 22.6; 307/303.1, 364, 570, 475, 454, 466, 445

[56] References Cited

U.S. PATENT DOCUMENTS

| 4,042,830 | 8/1977 | Kellerbenz et al. | 324/158 R |
| 4,465,971 | 8/1984 | Afeyta | 324/158 R |
| 5,068,599 | 11/1991 | Niehaus | 324/158 R |

FOREIGN PATENT DOCUMENTS 0166575 1/1986 European Pat. Off. .

OTHER PUBLICATIONS

Nagle, Jr. et al., "An Introduction To Computer Logic"; 1975; p. 94.
Publication: Journal of Semicustom ICs vol. 6, No. 4, Elsevier Science Publishers Ltd., England 1989, (Maunder) p. 25-27,29, "The status of IC design for-testability".
Publication "Integrierte Schaltungen in digitalen Systemen", (Integrated Circuits in Digital Systems) by Arvind Shah et al., 1977, pp. 329-331.

Primary Examiner—Vinh Nguyen
Attorney, Agent, or Firm—Herbert L. Lerner; Laurence A. Greenberg

[57] ABSTRACT

A circuit configuration for testing functional units in digital integrated circuits by means of test signals includes at least one OR switching element having inputs and an output. At least one of the inputs of the at least one OR switching element is occupied with signals to be tested. At least one further input of the at least one OR switching element is occupied with selection signals.

3 Claims, 2 Drawing Sheets

CIRCUIT CONFIGURATION FOR SIGNAL TESTING OF FUNCTIONAL UNITS OF INTEGRATED CIRCUITS

The invention relates to a circuit configuration for testing functional units in digital circuits by means of test signals.

During the planning phase of integral digital circuits, the logical behavior of the circuit is simulated with the aid of software programs. A check is thus made as to whether or not the circuit, that is made up of basic logical elements such as AND or OR switching stages, counters, and bistable multivibrators, is furnishing the desired logical result.

A circuit configuration which is constructed in that way, is then manufactured as an integrated circuit. In that process, each individual integrated circuit is tested for functional capability so as to recognize any production errors as much as possible. The test is carried out in such a way that the circuit is connected to an automatic tester, which applies a certain train of test signals to the inputs of the integrated circuit and compares the response of the circuit to the test signals, with the previously calculated result that would be produced if the circuit was functioning properly.

The problem in determining the test signals is that internal functional units of the IC are usually not directly connected to the input signal terminals. That means that they are either practically untestable, or the train of test signals becomes quite long, so that preparing them becomes increasingly more difficult for the development engineer.

By constructing the integrated circuit in a way that makes it easy to test, that is by adding further circuitry, a number of rules for constructing integrated digital circuits were established, with the intention of assuring their testability, even with highly complex circuits. Among the most important rules for easily testable circuit construction are the following:

resetting the memory elements to a defined initial state;

carrying internal circuit signals that are important for the test directly to the output; and introducing multiplexers, which switch over signal paths from the normal mode to the test mode, for instance in order to isolate individual function blocks and connect them directly to the signal input and output terminals of the component.

The scan path method was also developed, in order to test relatively large synchronized digital circuits systematically.

That test method is described, for instance, in a publication entitled "The Status of IC Design-for-Testability" by C. M. Maunder, which appeared in the Journal of Semicustom ICs, Vol. 6, No. 4, 1989, FIG. 2. The point of departure is the generally known block circuit diagram for the aforementioned circuitry, in which clock-controlled flip-flops are connected to one another through a combinatorial logic. A 2:1 multiplexer is provided at the input to each flip-flop, and with it a switchover between two signals at the data input of the flip-flop can be made. In normal operation, it is a data signal, which arrives from the combinatorial logic. In the test mode, the data input of one flip-flop is connected to the data output of an adjacent flip-flop. Accordingly, in the test mode, the memory elements are connected to a shift register. One input of the multiplexer of the first flip flop and the output of the last flip flop in the shift register are applied to a terminal of the integrated circuit. The control inputs of the multiplexers are also accessible from outside in common through an input signal terminal.

The integrated circuit is then tested as follows: Through the control signal input of the multiplexers, the flip-flops are connected as shift registers. Then, through the first input of the first multiplexer, a test signal train is inscribed in the shift register. Next, the multiplexers are adjusted in such a way that the circuit operates in the normal mode, causing the response of the combinatorial logic to the previously inscribed test signal train to be stored in the flip-flops. In the next step, operation is switched back to the shift register mode, and the contents are read out. That process is repeated for all of the test signal trains. Accordingly, in the scan path test method, the function of the combinatorial logic can be tested only through the data outputs and inputs of the flip flops. In particular, any signals that are important for the circuit test cannot be tested directly inside the combinatorial logic.

The scan path method described above requires an increased expense for circuitry. It includes using additional multiplexers at the data input of the flip-flops, which lengthen the signal transit times and increase the surface area needed.

It is accordingly an object of the invention to provide a circuit configuration for testing integrated digital circuits, which overcomes the hereinafore-mentioned disadvantages of the heretofore-known devices of this general type and with which the test can be made more flexible, by enabling arbitrary signals of the circuit to be selected as signals to be tested.

With the foregoing and other objects in view there is provided, in accordance with the invention, a circuit configuration for testing functional units in digital integrated circuits by means of test signals, comprising at least one OR switching element having inputs and an output; at least one of the inputs of the at least one OR switching element or elements being occupied with signals to be tested; at least one further input of the at least one OR switching element or elements being occupied with selection signals; an AND switching element having inputs and an output, the inputs of the AND switching element being connected to the output or outputs of the at least one OR switching element or elements; and the output of the AND switching element having a signal being carried to an output of the integrated circuit.

In accordance with another feature of the invention, the at least one OR switching element or each of the OR switching elements includes at least first, second and third emitter-coupled transistors having emitters, collectors and bases; and there is provided a fourth transistor having a an emitter, a collector and a base, the collector of the fourth transistor being connected to the emitters of the first, second and third transistors, a resistor connected between the emitter of the fourth transistor and a terminal of a first supply voltage source; the collectors of the first and second transistors being connected to one terminal of a second supply voltage source; the base terminals of the first and second transistors forming the inputs of the at least one OR switching element, and the collector of the third transistor forming the output of the at least one OR switching element.

In accordance with a further feature of the invention, there is provided a resistor, the AND switching element being formed by a connection of the collector of the third transistor of the at least one OR switching element, or of the third transistors of the OR switching elements in common, through the resistor to one terminal of the second supply voltage source; the base terminal of the third transistor of the at least one OR switching element, or of the third transistors of the OR switching elements in common, being connected to one terminal of a third supply voltage source; and another resistor, the base terminal of the fourth transistor of the at least one OR switching element, or of the fourth transistors of the OR switching elements in common, being connected to one terminal of a fourth supply voltage source and through the other resistor to one terminal of the first supply voltage source.

In accordance with a concomitant feature of the invention, there is provided a further OR switching element including first, second, third and fourth transistors having emitters, collectors and bases; the collector of the third transistor being connected to an input of at least one bistable multivibrator to be tested in an integrated digital circuit; the base of the third transistor of the further OR switching element being connected to the base of the third transistor or transistors of the at least one OR switching element or elements; and the base of the fourth transistor of the further OR switching element being connected to the base of the fourth transistor or transistors of the at least one OR switching element or elements.

Other features which are considered as characteristic for the invention are set forth in the appended claims.

Although the invention is illustrated and described herein as embodied in a circuit configuration for testing integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
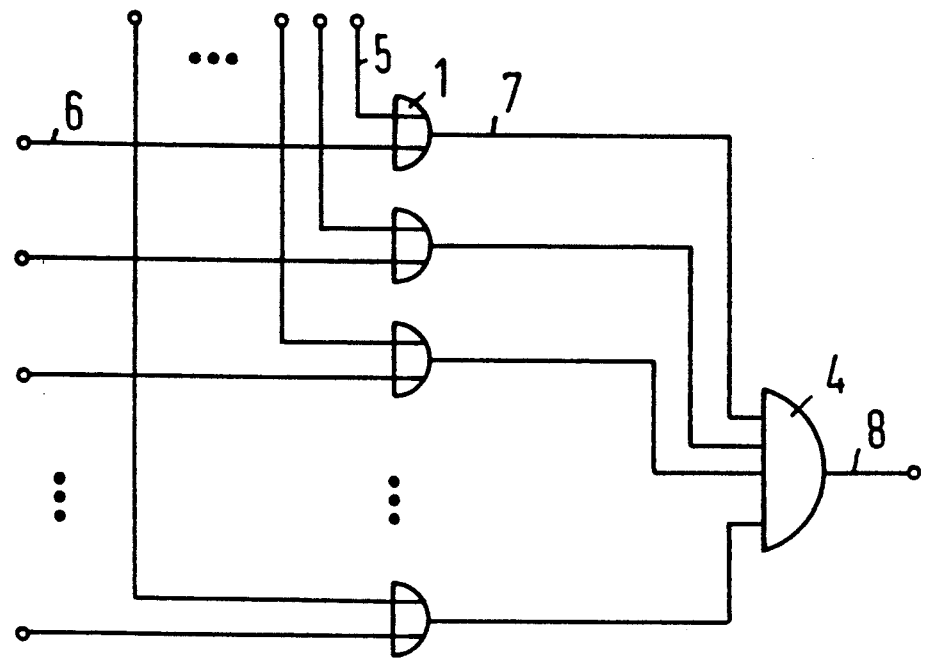
FIG. 1 is a schematic diagram of a circuit for testing signals, which is made up of AND and OR switching elements.

Referring now to the figures of the drawing in detail and first, particularly, to FIG. 1 thereof, there is seen a circuit which illustrates the principle of a test circuit using AND and OR switching elements. One of the OR switching elements is indicated by reference numeral 1. Outputs of a plurality of the OR switching elements having at least two inputs are connected to inputs of an AND switching element 4. One input of any one OR switching element is connected to a signal terminal to be tested, and a further input thereof is connected to a selection signal terminal of a selection signal line. One of the signal terminals to be tested is indicated by reference numeral 5 and one of the selection signal lines is indicated by reference numeral 6. An output 8 of the AND switching element 4 represents the output of this entire test circuit and can be carried to an output signal terminal of the semiconductor circuit.

The circuit functions as follows: For instance, the selection signal line 6 may be at L potential, while all of the other selection signal lines have a value H. An output 7 of the OR switching element 1 thus assumes the value H if the signal to be tested at the signal terminal 5 is H, and the output 7 assumes the value L if the terminal 5 is at L. The outputs of all of the other OR switching elements are at H. Correspondingly, the logical value of the test signal of the terminal 5 is established at the output 8 of the AND switching element 4. Thus the value of precisely the signal to be tested, having an associated selection signal which is at L potential, appears at the output 8 of the test circuit.

The test signal terminals can be connected to arbitrary signal terminals inside the integrated circuit. The selection signals can be generated in various ways depending on the application. If there is still enough space in the integrated semiconductor circuit for input signal terminals, then the selection signals can be applied from outside, for instance by being generated by automatic testers. It is also conceivable for a counter with suitable logic wiring, which generates the output signals, to be provided on the integrated semiconductor circuit. This counter can be connected to other such test circuits, which then operate in parallel. It need not be used solely for test purposes, but instead it can also be part of the circuit to be tested.

As in the case of the scan path test method discussed above, the test circuit of FIG. 1 can be used with all kinds of circuit techniques. However, in the bipolar common mode logic technique, such as emitter coupled logic (ECL) or current mode logic (CML) techniques, the problem of power loss arises. The multiplexers additionally needed for the circuit test in the scan path method are always active, even in the normal mode of the circuit. The power loss to be dissipated, which as a rule is a highly critical value for the circuit, is increased. In making the basic test circuit of FIG. 1 by common mode logic, a test circuit is obtained that can be switched off during normal operation of the circuit and entails no power loss.

Figure 2:
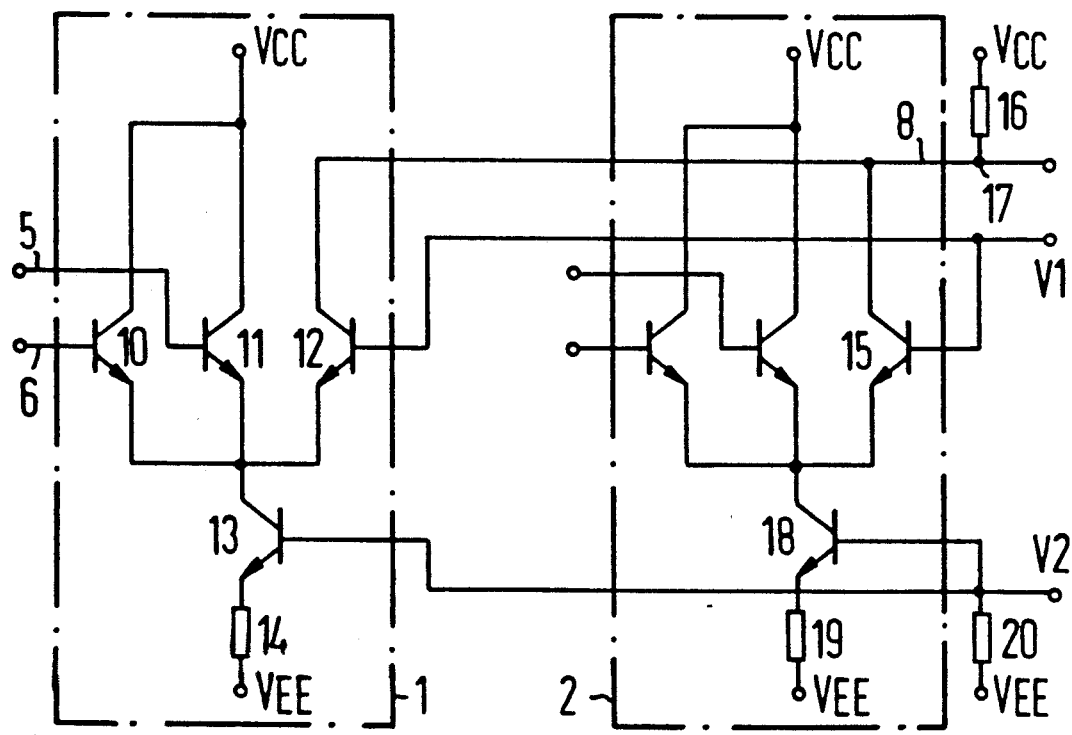
FIG. 2 is a schematic circuit diagram of an the embodiment of the circuit according to the common mode logic technique.

A common mode logic-type layout of the test circuit described in conjunction with FIG. 1 is shown in FIG. 2. For the sake of simplicity, only two OR switching elements 1, 2 are used. The OR switching element 1 has the following layout: Emitters of first, second and third emitter-coupled transistors 10, 11, 12 are connected to a collector of a fourth transistor 13, having an emitter which is connected through a resistor 14 to a terminal of a first supply voltage source VEE. The collectors of the first and second emitter-coupled transistors 10, 11 are connected to a second supply voltage source VCC. The base terminals of the first and second emitter-coupled transistors 10, 11 respectively represent the selection signal line 6 and the test signal terminal 5 of the OR switching element 1. The further OR switching element 2 is connected in parallel with the OR switching element 1 in such a manner that the collector of the third emitter-coupled transistor 12 of the OR switching element 1 and the collector of a third emitter-coupled transistor 15 of the OR switching element 2 are connected to one another and are connected through a resistor 16 to one terminal of the second supply voltage source VCC. The output signal at the output 8 is present at a connecting point 17. The base terminals of the third transistor 12, 15 of each OR switching element are also connected in common to a third supply potential source V1. Base terminals of the fourth transistor 13 of the OR switching element 1 and of a fourth transistor 18 of the OR switching element 2 are likewise connected in common to a fourth supply potential source V2 and are connected in common through a resistor 20 to one terminal of the first supply voltage source VEE.

Each of the transistors 13, 18 forms one current source together with the emitter-side resistor 14 and an emitter-side resistor 19. It is only during the test of the integrated semiconductor circuit that the fourth supply voltage source V2 is turned on, making the transistors 13, 18 conducting. In normal operation of the circuit to be tested, the fourth supply voltage source V2 is switched off, and the base terminals of the fourth transistors 13, 18 are connected to the first supply voltage VEE through the resistor 20 and are thus blocked. The power loss entailed by the circuit in FIG. 2 remains limited to the duration of the test.

In the following discussion it is assumed that the signal present at the terminal 5 is to be tested, or in other words the logical value of the signal at the terminal 5 should appear at the output 8. Typically, the output 8 is connected to an automatic tester, where it is compared with the value that has been previously calculated for proper functioning of the circuit to be tested. A selection logic, of the kind described in conjunction with FIG. 1, applies an L potential to the signal input line 6 and blocks the transistor 10. If the signal to be tested at the terminal 5 is also L, then the transistor 11 is blocked. The transistor 12 then conducts and brings about a voltage drop at the resistor 16, so that the output 8 likewise becomes L, in accordance with the signal to be tested at the terminal 5. If the signal to be tested has an H potential, then the transistor 11 becomes conducting. As a result, the transistor 12 blocks, and the output 8 is at the H potential VCC. In the discussion of FIG. 1, the selection signal level of the further OR switching element 2 is at H potential, so that its transistor 15 is blocked. No voltage drop at the resistor 16 is therefore brought about by the OR switching element 2. The logic function formed between the signals at the collectors of the transistors 12, 15 and the output 8 is an AND function, because the collectors of these transistors are connected and are applied to the supply voltage VCC through a resistor. This circuit is typically called a WIRED-AND circuit.

In comparison with the scan path method, the test circuit in FIG. 2 requires fewer transistors per signal to be tested: In order to achieve one OR switching element, four transistors and one resistor are used. The circuitry expenditure per signal to be tested for the WIRED-AND switching element, namely the resistors 16 and 20, is negligibly slight when 64 OR switching elements, for instance, are combined to make the WIRED-AND switching element. The expenditure for the control logic which is, for instance, intended to be constructed as a counter, where there is approximately one transistor per signal to be tested, is also quite low, if 20 test circuits of FIG. 1, for instance, are connected in parallel to one control logic. In comparison with the scan path method, which requires one multiplexer with approximately 10 transistors per signal to be tested, only approximately half as many transistors per signal to be tested are used.

Figure 3:
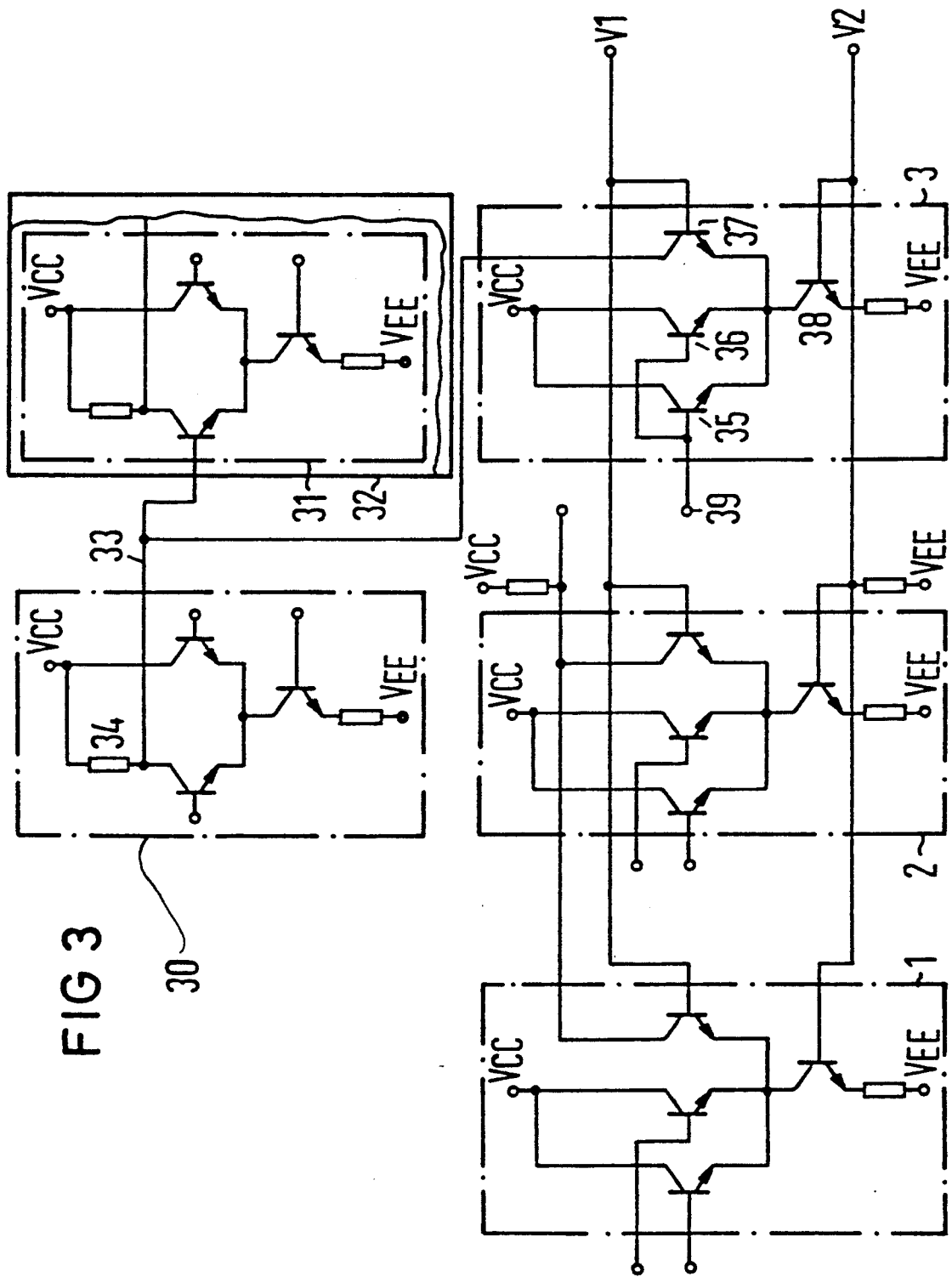
FIG. 3 is a schematic circuit diagram of an exemplary embodiment of a circuit for resetting flip-flops.

In testing integrated digital circuits, the problem often arises of setting bistable multivibrators to a defined logical value, for instance to L potential, at a predetermined time. FIG. 3 shows a further exemplary embodiment in response to this problem. The integrated digital circuit to be tested is assumed to be of the common mode logic type and includes a bistable multivibrator. An inverter 31 represents the switching element at the input of the bistable multivibrator. For instance, an inverter 30 is assumed to belong to the output of a functional unit connected to the input side of the bistable multivibrator. A collector of a transistor 37 of an OR switching element 3 is then connected to an input 33 of the bistable multivibrator, instead of to the WIRED-AND circuit of FIG. 2. Base terminals of transistors 35 and 36 are connected to one another and form a selection signal input 39 of the OR switching element 3. In addition, as described in conjunction with FIG. 2, base terminals of the transistor 37 and of a transistor 38 are connected to the other OR switching elements 2, 3. As a result of an L level of the selection signal at the input 39, the transistors 35, 36 are blocked and the transistor 37 is made conducting. This causes a voltage drop at a resistor 34 of the inverter 30 and connects the input 33 of the bistable multivibrator to L potential. A resetting logic integrated with a flip-flop, if it were needed only for testing the circuit, thus becomes unnecessary. Only a part 32 of the flip-flop is shown.

I claim:

1. A circuit configuration for testing functional units in digital integrated circuits by means of test signals, comprising:
    a plurality of selection devices;
    each of said selection devices including
        first, second, third and fourth transistors each having an emitter, a collector and a base;
        said emitters of said first, second and third transistors of each of said selection devices being coupled to one another;
        a resistor connected to said emitter of said fourth transistor, said coupled emitters of said first, second and third transistors being connected through an emitter-to-collector path of said fourth transistor and said resistor to a first supply voltage potential;
        said collectors of said first and second transistor being connected to a second supply voltage potential;
        said base of said first transistor being a connection for a selection signal, and said base of said second transistor being a connection for a signal to be tested;
        said base of said third transistor being connected to a third supply voltage potential;
        said base of said fourth transistor being connected to a fourth supply voltage potential; and
    a further resistor, each of said collectors of said third transistors of said selection devices being connected to the second supply voltage potential through said further resistor.

2. the circuit configuration according to claim 1, including an additional resistor, the fourth supply voltage potential being connected to the first supply voltage potential through said additional resistor.

3. The circuit configuration according to claim 1, wherein said collector of said third transistor of at least one of said selection devices is connected with an input of a flip-flop to be tested.

* * * * *